(12) United States Patent
Belluomini et al.

(10) Patent No.: US 6,873,188 B2
(45) Date of Patent: Mar. 29, 2005

(54) LIMITED SWITCH DYNAMIC LOGIC SELECTOR CIRCUITS

(75) Inventors: Wendy A. Belluomini, Austin, TX (US); Robert K. Montoye, Austin, TX (US); Hung C. Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 10/242,236

(22) Filed: Sep. 12, 2002

(65) Prior Publication Data

US 2004/0051560 A1 Mar. 18, 2004

(51) Int. Cl.[7] ........................................... H03K 19/096
(52) U.S. Cl. ............................. 326/98; 326/95; 326/94
(58) Field of Search ............................ 326/93–98, 105, 326/106

(56) References Cited

U.S. PATENT DOCUMENTS

| | | | | |
|---|---|---|---|---|
| 5,543,731 A | * | 8/1996 | Sigal et al. | 326/40 |
| 6,023,179 A | * | 2/2000 | Klass | 327/211 |
| 6,087,855 A | * | 7/2000 | Frederick et al. | 326/106 |
| 6,459,316 B1 | * | 10/2002 | Vangal et al. | 327/202 |

OTHER PUBLICATIONS

Figure—Alliance 97, Mux Latch, one page.
Durham–IBM, Figure—The 630FP Approach to Clocking and Latching, Domino Mid–Cycle Latch (DMCL), ARL Clocking & Latch Workshop, Mar. 18–20, 1997, p. 16.
Sigal et al., "Circuit design techniques for the high–performance CMOS IBM S/390 Parallel Enterprise Server G4 microprocessor," IBM J. Res. Develop, vol. 41, No. 4/5, Jul./Sep. 1997, pp. 489–501.

* cited by examiner

Primary Examiner—Anh Q. Tran
(74) Attorney, Agent, or Firm—Richard F. Frankeny; Winstead Sechrest & Minick P.C.; Casimer K. Salys

(57) ABSTRACT

Selector circuits and systems for single and multilevel selection within one clock cycle having a static switching factor on the output of a dynamic logic circuit. A logic device for single and multilevel selection having a dynamic logic circuit portion and a static logic circuit portion is implemented. In this way, an output logic state is maintained so long as the value of the Boolean operation being performed by the logic device does not change. Additionally, static logic elements may perform the inversions necessary to output both logic senses, mitigating the need to provide for dual-rail dynamic logic implementations. An asymmetric clock permits a concomitant decrease in the size of the precharge transistors thus ameliorating the area required by the logic element and obviating a need for keeper device.

14 Claims, 9 Drawing Sheets

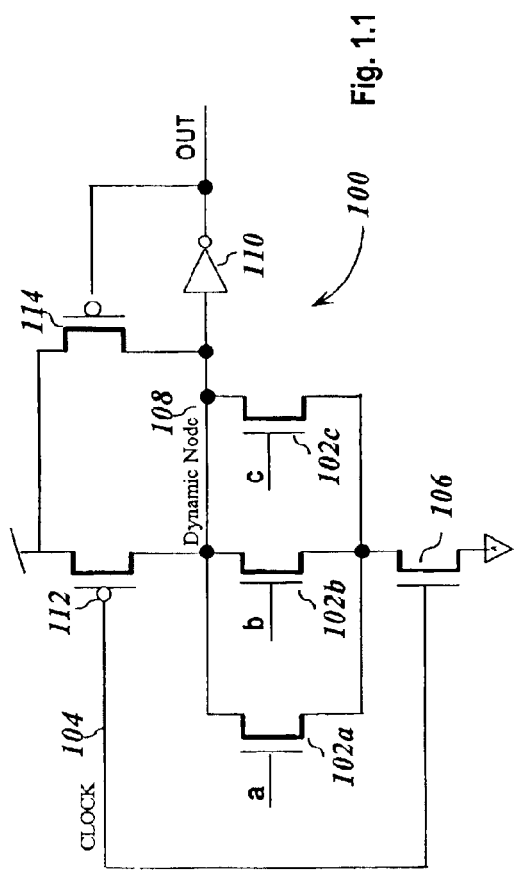
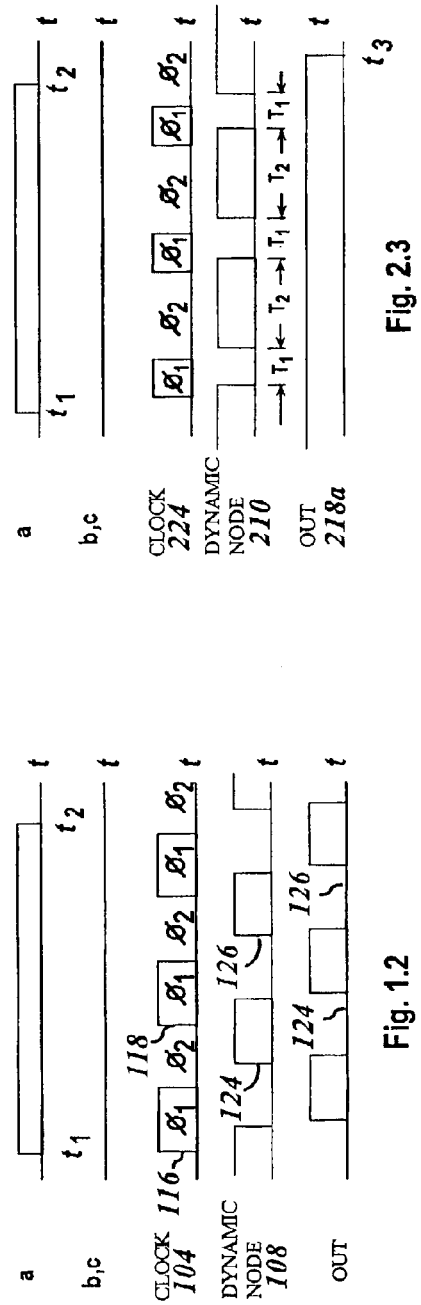

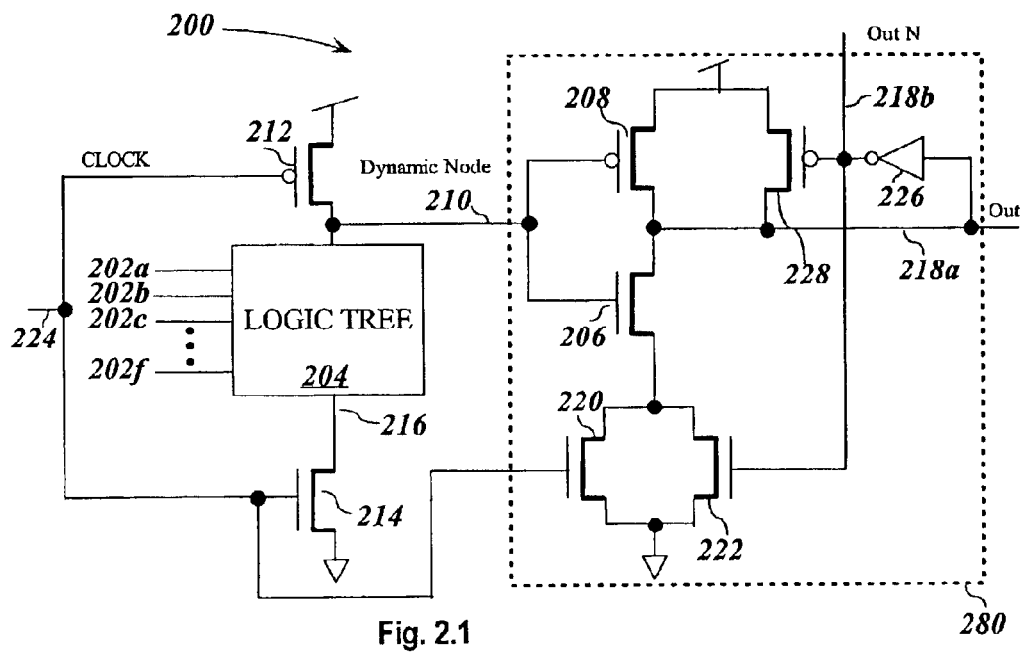
Fig. 2.1
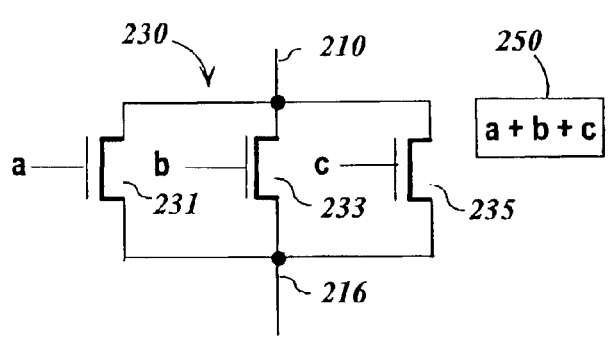
Fig. 2.2.1
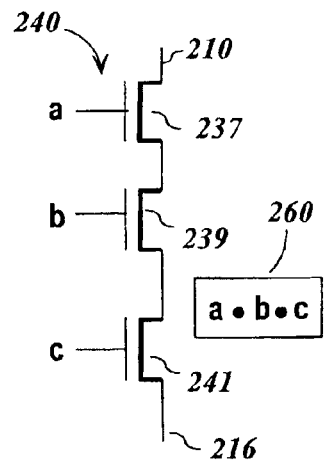
Fig. 2.2.2

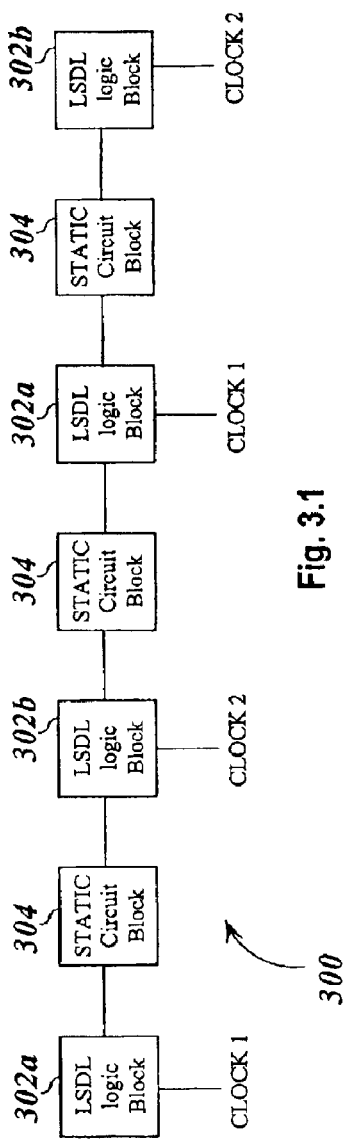
Fig. 3.1
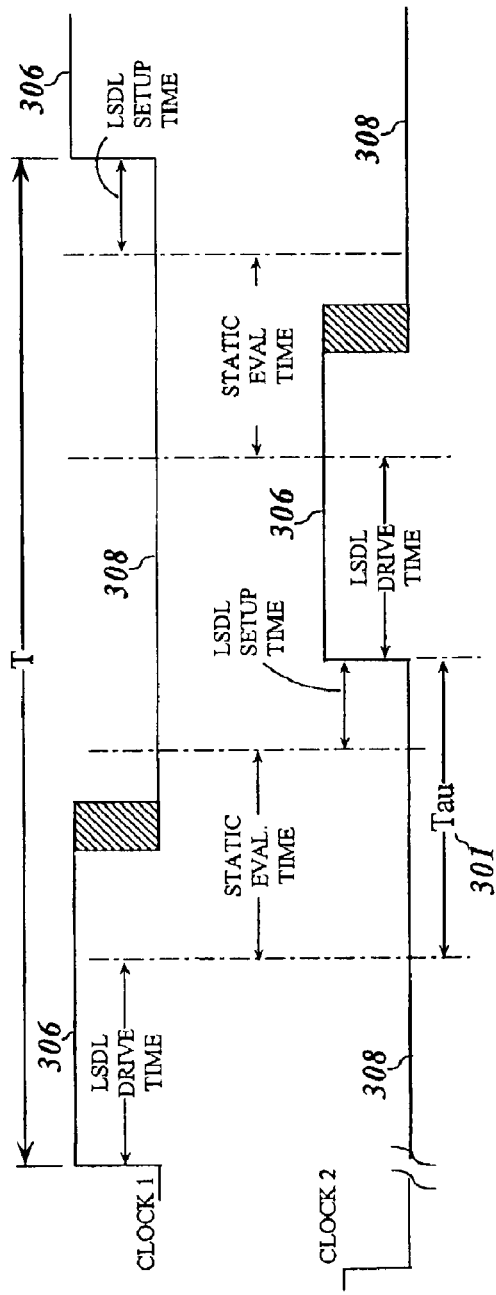
Fig. 3.2

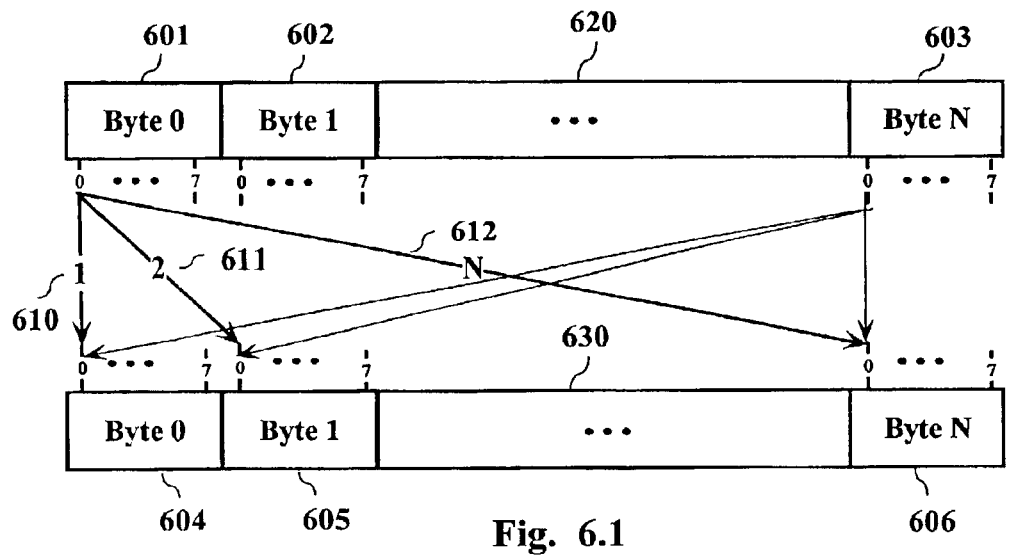
Fig. 6.1
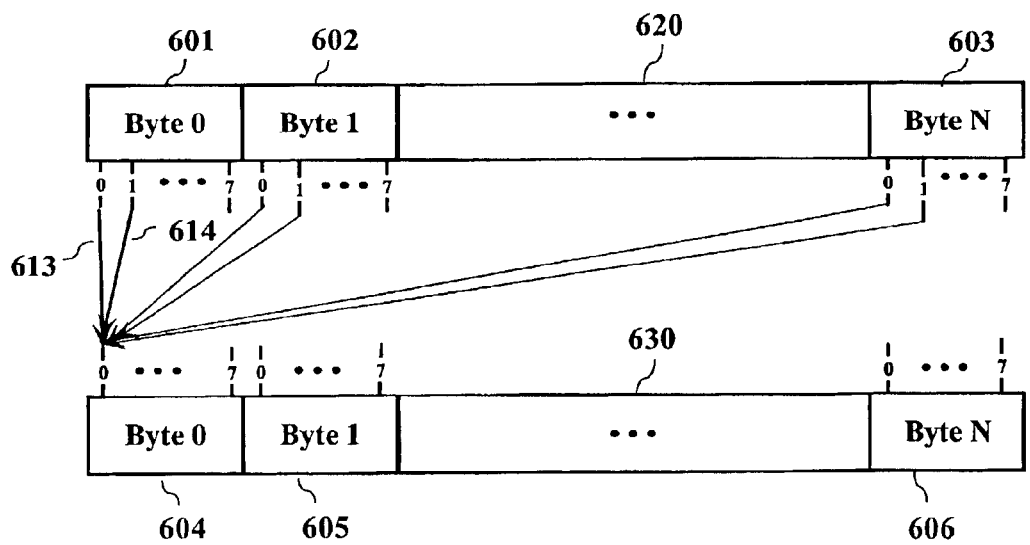
Fig. 6.2

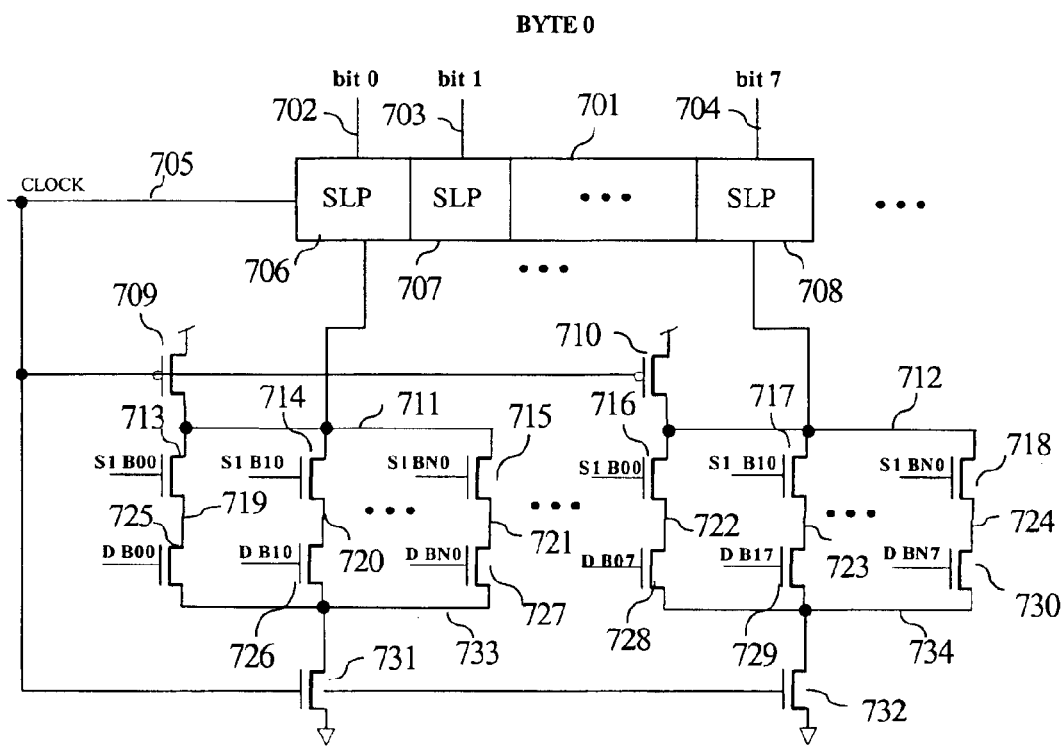
Fig. 7.1

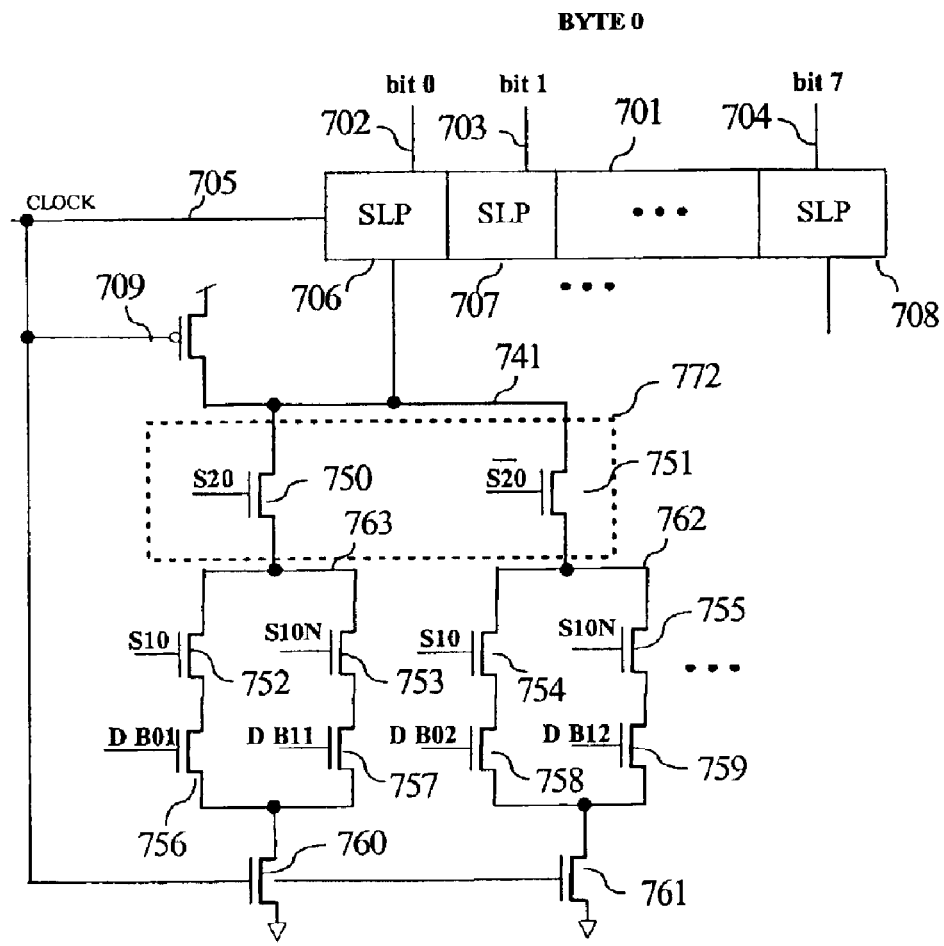
Fig. 7.2

LIMITED SWITCH DYNAMIC LOGIC SELECTOR CIRCUITS

CROSS REFERENCE TO RELATED APPLICATION

The present invention is related to the following U.S. Patent Applications which are incorporated by reference:

Ser. No. 10/116,612, filed Apr. 4, 2002, entitled, "Circuits And Systems For Limited Switch Dynamic Logic;" and Ser. No. 10/242,214 entitled "A Limited Switch Dynamic Logic Circuit" filed concurrently herewith.

TECHNICAL FIELD

The present invention relates to dynamic logic circuits, and in particular, to dynamic logic circuits for single and multilevel selection where the dynamic logic circuits have a dynamic switching factor to reduce power consumption.

BACKGROUND INFORMATION

Modern data processing systems may perform Boolean operations on a set of signals using dynamic logic circuits. Dynamic logic circuits are clocked. During the precharge phase of the clock, the circuit is preconditioned, typically, by precharging an internal node (dynamic node) of the circuit by coupling to a power supply rail. During an evaluate phase of the clock, the Boolean function being implemented by the logic circuit is evaluated in response to the set of input signal values appearing on the inputs during the evaluate phase. (For the purposes herein, it suffices to assume that the input signals have settled to their "steady-state" values for the current clock cycle, recognizing that the input value may change from clock cycle to clock cycle.) Such dynamic logic may have advantages in both speed and the area consumed on the chip over static logic. However, the switching of the output node with the toggling of the phase of the clock each cycle may consume power even when the logical value of the output is otherwise unchanged.

This may be appreciated by referring to FIG. 1.1 illustrating an exemplary three-input OR dynamic logic gate, and the accompanying timing diagram, FIG. 1.2. Dynamic logic 100, FIG. 1.1, includes three inputs a, b and c coupled to a corresponding gate of NFETs 102a–102c. During an evaluate phase of clock 104, $N_1$, NFET 106 is active, and if any of inputs a, b or c are active, dynamic node 108 is pulled low, and the output OUT goes "high" via inverter 110. Thus, referring to FIG. 1.2, which is illustrative, at $t_1$ input a goes high during a precharge phase $N_2$ of clock 104. During the precharge phase $N_2$ of clock 104, dynamic node 108 is precharged via PFET 112. Half-latch PFET 114 maintains the charge on dynamic node 108 through the evaluate phase, unless one or more of inputs a, b or c is asserted. In the illustrative timing diagrams in FIG. 1.2, input a is "high" having a time interval $t_1$ through $t_2$ that spans approximately 2½ cycles of clock 104, which includes evaluation phases, 116 and 118. Consequently, dynamic node 108 undergoes two discharge-precharge cycles, 124 and 126. The output node similarly undergoes two discharge-precharge cycles, albeit with opposite phase, 124 and 126. Because the output is discharged during the precharge phase of dynamic node 108, even though the Boolean value of the logical function is "true" (that is, "high" in the embodiment of OR gate 100) the dynamic logic dissipates power even when the input signal states are unchanged.

Additionally, dynamic logic may be implemented in a dual rail embodiment in which all of the logic is duplicated, one gate for each sense of the data. That is, each logic element includes a gate to produce the output signal, and an additional gate to produce its complement. Such implementations may exacerbate the power dissipation in dynamic logic elements, as well as obviate the area advantages of dynamic logic embodiments.

Selection circuits, including shifting circuits and multiplexors, are used extensively within computer systems. Some of these selection circuits require multiple levels of selection, for example, a first input is selected from a plurality of first inputs wherein each of the first inputs are additionally selected from a plurality of second inputs. Computer systems employing dynamic logic may find that it is difficult to implement selection circuits for single and multilevel selection from many inputs because of the limitations of required precharge and evaluation times as well as the fact that outputs are not held during the precharge cycle.

Limited switching dynamic logic (LSDL) circuits produce circuits which mitigate the dynamic switching factor of dynamic logic gates with the addition of static logic devices which serve to isolate the dynamic node from the output node. Co-pending U.S. Patent Application entitled, "CIRCUITS AND SYSTEMS FOR LIMITED SWITCH DYNAMIC LOGIC," Ser. No. 10/116,612 filed Apr. 4, 2002 and commonly owned, recites such circuits. Additionally, LSDL circuits and systems maintain the area advantage of dynamic logic over static circuits, and further provide both logic senses, that is, the output value and its complement. Therefore, there is a need for the advantages of LSDL to be used to implement multilevel selection circuits with large numbers of inputs.

SUMMARY OF THE INVENTION

The aforementioned needs are addressed by the present invention. Accordingly, there is an LSDL circuit configuration with a dynamic logic circuit having a corresponding dynamic node, and a plurality of logic input signals and selection signals, wherein the dynamic node has a precharge value during a first phase of a clock signal and an asserted value corresponding to a Boolean function of one or more input signals during the second phase of the clock signal. The value of the Boolean function is generated on one or more common nodes that are exclusively coupled to the dynamic node in response to one or more select signals. The dynamic node is further coupled to a static logic circuit which further generates an output and complement output of the LSDL circuit that is the value corresponding to the Boolean function of the values of the input signals selected by one of the select signals. The static logic section outputs the values of the dynamic node during the first phase of the clock signal and holds the value of the dynamic node during the second phase of the clock signal.

Additionally, there are provided an integrated circuit (IC) and a data processing system including a plurality of logic devices for asserting a selected Boolean function of one or more input signals on a dynamic node. Also included is a static logic circuit coupled to the dynamic node wherein the static logic is configured to output the value of the dynamic node during a first phase of the clock signal while maintaining the output value of the logic device during a second phase of the clock signal; the output value represents the selected Boolean function of one or more input signals asserted on the dynamic node. Also a duration of the first phase of the clock signal is less than a duration of the second phase of the clock signal.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings in which:

FIG. 1.1 illustrates, in partial schematic form, a dynamic logic gate which may be used in conjunction with the present invention;

FIG. 1.2 illustrates a timing diagram corresponding to the logic gate embodiment illustrated in FIG. 1.1;

FIG. 2.1 illustrates, in partial schematic form, a standard LSDL device illustrating the static logic devices for isolating the dynamic node from the output node;

FIG. 2.2.1 illustrates, in partial schematic form, circuitry for incorporation in the logic tree of FIG. 2.1 whereby the logic function performed is the logical OR of three input signals;

FIG. 2.2.2 illustrates, in partial schematic form, another circuit for incorporation in the logic tree of FIG. 2.1 whereby the logic function performed is the logical AND of three input signals;

FIG. 2.3 illustrates a timing diagram corresponding to an embodiment of the dynamic logic device of FIG. 2.1 in which the logic function performed is the logical OR of three input signals;

FIG. 3.1 illustrates, in block diagram form, an LSDL system that may incorporate LSDL selection circuits in accordance with embodiments of the present invention;

FIG. 3.2 illustrates a two-phase clock which may be used in conjunction with the logic system of FIG. 3.1;

FIGS. 6.1 and 6.2 are block diagrams of selection options used between an input and output word in an LSDL system employing embodiments of the present invention;

FIG. 7.1 is a circuit diagram of a selection circuit according to embodiments of the present invention;

FIG. 7.2 is a circuit diagram of another selection circuit according to embodiments of the present invention.

DETAILED DESCRIPTION

Figure 4:
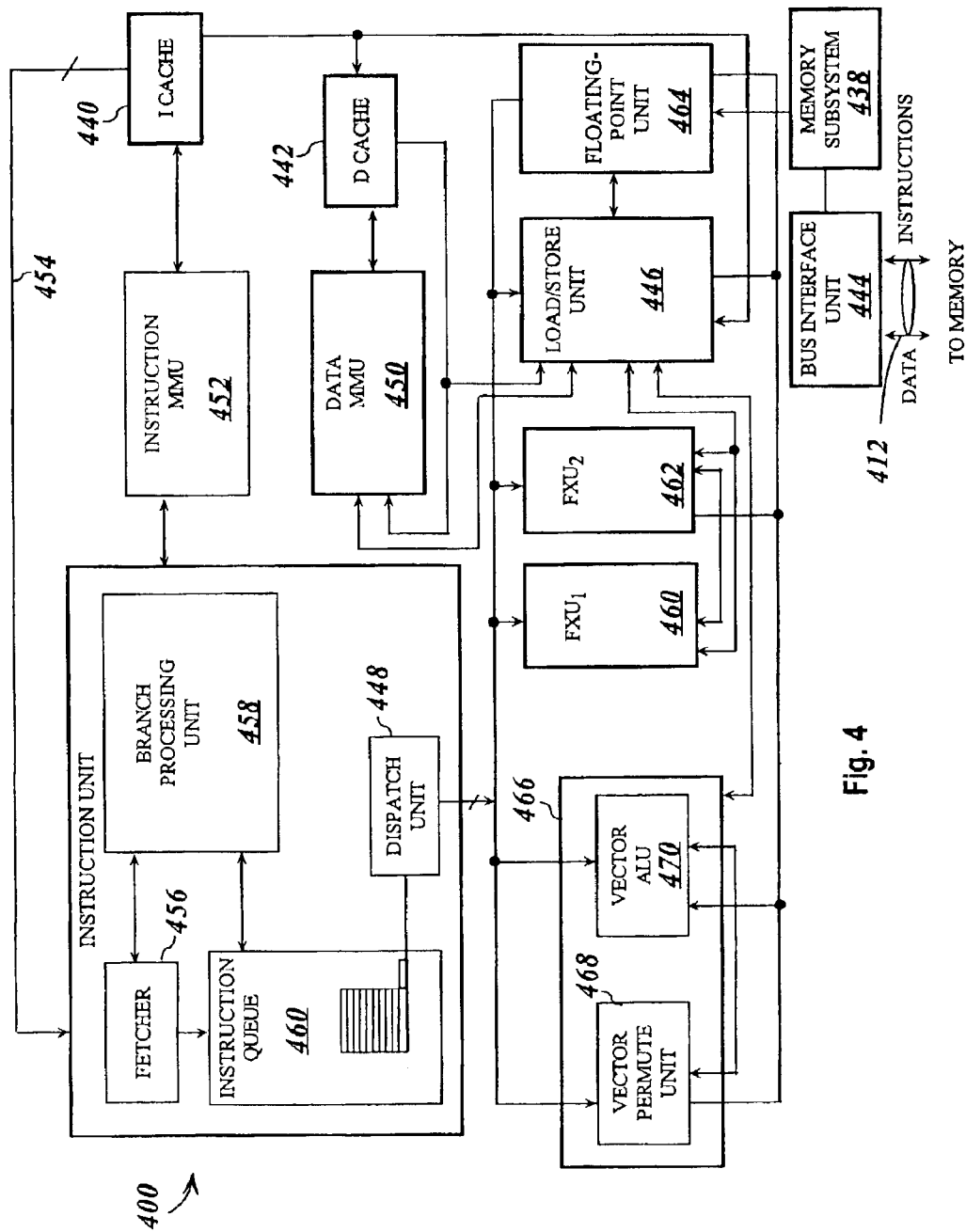
FIG. 4 illustrates a high level block diagram of selected operational blocks within a central processing unit (CPU) incorporating the present inventive principles.

In the following description, numerous specific details are set forth to provide a thorough understanding of the present invention. For example, specific logic functions and the circuitry for generating them may be described; however, it would be recognized by those of ordinary skill in the art that the present invention may be practiced without such specific details. In other instances, well-known circuits have been shown in block diagram form in order not to obscure the present invention in unnecessary detail. Refer now to the drawings wherein depicted elements are not necessarily shown to scale and wherein like or similar elements are designated by the same reference numeral by the several views.

FIG. 2.1 illustrates a limited switch dynamic logic (LSDL) device 200 used in accordance with the present inventive principles. In general, LSDL device 200 receives a plurality, n, of inputs 202a . . . 202d provided to logic tree 204, and outputs a Boolean combination of the inputs. The particular Boolean function performed by LSDL device 200 is reflected in the implementation of logic tree 204 (accounting for the inversion performed by the inverter formed by n-channel field effect transistor (NFET) 206 and p-channel field effect transistor (PFET) 208). Logic tree 204 is coupled between the drain of PFET 212 and the drain of NFET 214, node 216. The junction of the logic tree 204 and the drain of PFET 212 forms dynamic node 210.

For example, FIG. 2.2.1 illustrates logic tree 230 including three parallel connected NFETs, 231, 233 and 235. Logic tree 230 may be used to provide a logic device generating the logical NOR of the three input signals coupled to corresponding ones of the gates of NFETs 231, 233 and 235, a, b and c (as indicated by the Boolean expression 250 in FIG. 2.2.1) and accounting for the inversion via NFET 206 and PFET 208. Similarly, FIG. 2.2.2 illustrates a logic tree 240 including three serially connected NFETs 237, 239 and 241. Logic tree 240 may be used in conjunction with the logic device 200 to generate the logical NAND of the three input signals a, b and c (as indicated by the Boolean expression 260 in FIG. 2.2.2).

Returning to FIG. 2.2.1, dynamic node 210 is coupled to the common junction of the gates of NFET 206 and PFET 208 which invert the signal on dynamic node 210. The inversion of the signal on dynamic node 210 is provided on Out 218a. The transistor pair, 206 and 208, is serially coupled to parallel NFETs 220 and 222. NFET 220 is switched by clock signal 224. Thus, during the evaluate phase of clock signal 224, the inverter pair, NFET 206 and PFET 208 are coupled between the supply rails by the action of NFET 220.

The operation of LSDL device 200 during the evaluate phase, $N_1$, may be further understood by referring to FIG. 2.3 illustrating an exemplary timing diagram corresponding to the dynamic logic circuit of FIG. 2.1 in combination with a logic tree embodiment 230 of FIG. 2.2.1. In this way, for purposes of illustration, the timing diagram in FIG. 2.3 is the counterpart to the timing diagram in FIG. 1.2 for the three-input OR gate 100 depicted in FIG. 1.1. As shown, input a is "high" or "true" between $t_1$, and $t_2$. In the evaluate phase, $N_1$ of clock signal 224, dynamic node 210 is pulled down (intervals $T_1$). In these intervals, Out 218a is held high by the action of the inverter formed by transistors 206 and 208, which inverter is active through the action of NFET 220 as previously described. In the intervening intervals, $T_2$, dynamic node 210 is pulled up via the action of the pre-charge phase, $N_2$ of clock signal 224, and PFET 212. In these intervals, the inverter is inactive as NFET 220 is off. Out 218a is held "high" by the action of inverter 226 and PFET 228. Note also that the output of inverter 226 may provide a complementary output, Out N 218b. (Thus, with respect to the three-input logic trees in FIGS. 2.2.1 and 2.2.2, the corresponding logic device represents a three-input OR gate and a three-input AND gate, respectively.)

Returning to FIG. 2.1, if the logic tree evaluates "high", that is the Boolean combination of inputs 202a . . . 202d represented by logic tree 204, evaluate high, whereby dynamic node 210 maintains its precharge, Out 218a is discharged via NFET 206 and NFET 220. In the subsequent precharge phase, $N_2$, of clock signal 224, Out 218a is latched via the action of inverter 226 and NFET 222. Thus, referring again to FIG. 2.3, corresponding to the three input OR embodiment of logic device 200 and logic tree 230 (FIG. 2.2.1) at $t_2$ input a falls, and in the succeeding evaluate phase of clock signal 224, dynamic node 210 is held high by the precharge. The inverter pair, NFETs 206 and 208, are active in the evaluate phase of $N_1$, of clock signal 224 because of the action of NFET 220. Consequently, Out 218a falls ($t_3$). In the succeeding precharge phase, $N_2$ of clock signal 224, Out 218a is latched in the "low" state, as previously described.

In this way, LSDL device 200 in FIG. 2.1, may provide a static switching factor on Out 218a, and likewise with respect to the complementary output Out N 218b. It would also be recognized by artisans of ordinary skill that although LSDL device 200, FIG. 2.1, has been described in conjunction with the particular logic tree embodiments of FIG. 2.2.1 and FIG. 2.2.2, the principles of the present invention apply to alternative embodiments having other logic tree implementations, and such alternative embodiments fall within the spirit and the scope of the present invention.

Note too, as illustrated in the exemplary timing diagram in FIG. 2.3, the duty factor of the clock signal may have a value that is less than fifty percent (50%). In such an embodiment, the evaluate phase, $N_1$, of the clock signal may be shorter in duration than the precharge phase, $N_2$. A clock signal having a duty factor less than fifty percent (50%) may be referred to as a pulse (or pulsed) clock signal. Note that a width of the evaluate phase may be sufficiently short that leakage from the dynamic node may be inconsequential. That is, leakage does not affect the evaluation of the node.

In such a clock signal embodiment, the size of the precharge device (PFET 212 in the embodiment of FIG. 2.1) may be reduced. It would be recognized by those of ordinary skill in the art that a symmetric clock signal has a fifty percent (50%) duty cycle; in an embodiment in which the duty cycle of the clock signal is less than fifty percent (50%), the size of the precharge device may be reduced concomitantly. In particular, an embodiment of the present invention may be implemented with a clock signal duty cycle of approximately thirty percent (30%). Additionally, while logic device 200 has been described from the perspective of "positive" logic, alternative embodiments in accordance with the present inventive principles may be implemented in the context of "negative" logic and such embodiments would also fall within the spirit and scope of the present invention.

PFETs 208 and 228, NFETs 206, 220, and 222, and inverter 226 make an implementation of a static latching portion of LSDL 200 that is used in LSDL selection circuits according to embodiments of the present invention. A dotted line has been drawn around this group of devices designating it as static latch portion (SLP) 250. This designation is used in the following sections to simplify explanation of principles of the present invention.

The preceding example in FIG. 2.1 explains the operation of an LSDL circuit used to generate a Boolean combination of a number of inputs. In other logic circuits, it is desirable to generate selector functions wherein LSDL circuits are used to select between multiple inputs and direct the inputs to selected outputs. A selection circuit is often called a multiplexor (MUX) if it makes a selection between a plurality of inputs and directs one of the inputs to a particular output. MUX circuits are used extensively in computers. Because of the wide data busses used in modem computers, MUX circuits may require a large number of inputs. MUX circuits may be used to direct a particular bit (e.g., bit IB0) from multiple input bytes (e.g., input byte 0 through byte N) to same bit (e.g., bit OB0) in an output byte (e.g., output byte 0). Other types of selector circuits are used to permutate bits such that a particular bit (e.g., bit B0) in a byte may be selected from multiple bits in another byte (e.g., bit B0 or B1). These selector circuits may be termed shift circuits or permutation circuits. Generally in logic permutation, a binary word has its bits reordered (permuted) and the number of possibilities is N factorial (N!) where N is the total number of bits in the word. Shifting may be thought of as a sub-set of general permutation.

FIGS. 6.1 and 6.2 are block diagrams illustrating how bits in an input word 620 comprising Byte 0 601, Byte 1 602 through Byte N 603 may be directed to an output word 630 comprising Bytes 0 604, Byte 1 605 through Byte N 606. In FIG. 6.1, bit 0 of Byte 0 601 may be directed on path 610 to bit 0 of Byte 0 604, path 611 to bit 0 of Byte 1 605 through Byte N 606. FIG. 6.1 represents a MUX function where one input (e.g., bit 0 of Byte 0 601) may be selectively directed to several outputs (e.g., bit 0 of Byte 0 604 to bit 0 of Byte N 606). FIG. 6.2 represents more of a shift or permute function where multiple bits in particular bytes (e.g., bits 0 and 1 of Byte 0 601) may be directed to a particular bit (e.g., bit 0 of Byte 0 601). The operation illustrated in FIG. 6.1 requires N selection devices (not shown) between the N bytes of the input word 620 and a particular bit (e.g., bit 0 of Byte 0 604) in the output word 630.

FIG. 7.1 is a circuit diagram of an LSDL selection circuit according to embodiments of the present invention. Byte 0 701 represents an output byte of an output word (e.g., output word 630) which is selectively receiving data from a plurality of bytes from an input word (e.g., input word 620). Exemplary Byte 0 701 has eight bits, bit 0 702 through bit 7 704. Each bit has a corresponding SLP circuit (e.g., SLP 706) substantially the same as SLP 280 explained in FIG. 2.1. The selection circuitry is shown for only SLP 706 and SLP 708. Clock 705 is directed to each SLP circuit in Byte 0 701. While each SLP circuit generates an output and complement output, only one output is shown for simplicity.

The input to SLP 706 is coupled to dynamic node 711 which is precharged with precharge PFET 709 during the logic zero phase of clock signal 705. Clock signal 705 is also coupled to the gate of NFET 731 which serves to isolate the circuitry between dynamic node 711 and node 733. During the logic zero phase of clock signal 705, NFET 731 is gated OFF allowing dynamic node 711 to precharge regardless of the states of the devices between dynamic node 711 and node 733. A plurality of logic trees are coupled between dynamic node 711 and node 733. In this example, the logic trees make up a MUX for data bit 0 from N input bytes. In the circuit of FIG. 7.1, data bit 0 from the N input bytes may be selectively coupled to bit 0 702 of Byte 0 701. Since there are N bit zeroes (bit 0), there are N logic trees. NFET 713 and NFET 725 make up the logic tree for data bit 0 of input Byte 0 (D B00), NFET 714 and NFET 726 make up the logic tree for data bit 0 of input Byte 1 (D B10), and sequentially through to NFET 715 and NFET 727 which make up the logic tree from data bit 0 of input Byte N (D BN0). NFET 713, NFET 714, and NFET 715 selectively couple their corresponding common nodes 719, 720 and 721 to dynamic node 711 in response to their select signals S1 B00, S1 B10 and S1 BN0, respectively. The select signals (S1 B00, S1 B10 and S1 BN0) are termed "one hot" signals which indicates that at any one select time only one signal is a logic true activating its corresponding select device (e.g., NFET 713). Because of the previously explained latching function of the SLP circuits, the precharge portion of the clock signal 705 is longer than the evaluate portion. Since the precharge time is longer, the precharge devices are smaller and have less capacitance. This allows many parallel devices to be coupled to dynamic node 711 resulting in a large number of inputs forming a many to one MUX function.

All the bits in Byte 0 701 have a corresponding selection circuit. The circuitry for bit 7 of Byte 0 701 is also shown for example. Similar to bit 0, data bit 7 from the N input bytes may be selectively coupled to bit 7 704 of Byte 0 701. Since there are N bit sevens (bit 7), again there are N logic trees. NFET 716 and NFET 728 make up the logic tree for data bit 7 of input Byte 0 (D B07), NFET 717 and NFET 729 make up the logic tree for data bit 7 of input Byte 1 (D B17), and sequentially through to NFET 718 and NFET 730 which make up the logic tree from data bit 7 of input Byte N (D BN7). NFET 716, NFET 717, and NFET 718 selectively couple their corresponding common nodes 722, 723 and 724 to dynamic node 712 in response to their select signals S1 B00, S1 B10 and S1 BN0, respectively. In the example of FIG. 7.1, the selection is byte-wise. This means that if any bit in a particular input byte (e.g., input Byte 1) is directed to output Byte 0 701, then all the bits of that byte are directed to Byte 0 701. This would insure that all the select signals (S1 B00-S1 BN0) are the same for each bit in the byte.

To further explain the operation of the selection circuitry of FIG. 7.1, only one bit need be explained in detail as the selection of all other bits operate the same. Assume then that S1 B10 is a logic one and all other selection signals are a logic zero (one-hot principle). This means that the bits from input Byte 1 are directed to output Byte 0 701. Also assume that the particular bit 0 from Byte 1 of the input word (D B10) is also a logic one. S1 B10 is activated coincident with the precharge phase (logic zero) of clock signal 705. PFET 709 turns ON and NFET 731 turns OFF isolating the logic trees, and in particular, the logic tree comprising the series connection of NFET 714 and NFET 726. Since S1 B10 is a logic one both dynamic node 711 and common node 720 are precharged during the precharge phase of clock signal 705. This insures that when the values asserted on dynamic node 711 by the state of D B10 during the evaluation phase of clock signal 705 is correct. For example, assume the previous state of D B10 was a logic one and common node 720 was discharged to ground. If the next state of D B10 is a logic zero, then node 720 would modify dynamic node 711 if it had not also been precharged along with dynamic node 711 during the precharge phase of clock signal 705. When clock signal 705 transitions to its evaluate phase, PFET 709 is turned OFF and NFET 731 is turned on allowing a logic one state of D B10 to discharge dynamic node 711 or a logic zero state of D B10 to leave dynamic node 711 in a logic one charged state. SLP 706 asserts the logic one value of dynamic node 711 to output bit 0 702 of Byte 0 701. Feedback from the output of SLP 706 then latches the output state so that it remains during the next precharge phase of clock signal 705.

FIG. 7.2 is another selection circuit according to embodiments of the present invention illustrating multilevel selection. Again, Byte 0 701 represents an output byte of an output word (e.g., output word 630) which is selectively receiving data from a plurality of bytes from an input word (e.g., input word 620). Exemplary Byte 0 701 has eight bits, bit 0 702 through bit 7 704. Each bit has a corresponding SLP circuit (e.g., SLP 706) substantially the same as SLP 280, explained in FIG. 2.1. The selection circuitry is shown for only SLP 706 and SLP 708. Clock 705 is directed to each SLP circuit in Byte 0 701. While each SLP circuit generates an output and complement output, only one output is shown for simplicity.

PFET 709 turns ON and NFETs 760 and 761 are gated OFF during the precharge phase of clock signal 705. Dynamic node 741 is precharged by PFET 709 during the precharge phase of clock signal 705. Section circuit 772, comprising NFET 750 and NFET 751, selectively couples dynamic node 741 to node 763 and 762 in response to select signals S20 and S20N. S20 and S20N are complement logic signals and therefore are one-hot select signals. The logic tree coupled to common node 763 selects between D B01 and D B11 (bit 0 and bit 1 of input Byte 1) in response to select signals S10 and S10N. Likewise, the logic tree coupled to common node 762 selects between D B02 and D B12 (bit 0 and bit 1 of input Byte 2) in response to select signals S10 and S10N. If S10 is a logic one, then the value of D B01 or D B02 will be asserted on dynamic node 741 depending on the states of S20 and S20N during the assertion phase of clock signal 705. During the precharge phase, either common node 763 or 762 will be precharged along with dynamic node 741 guaranteeing that whichever logic tree is selected by S20/S20N will have its common node precharged. Other logic tree configurations may be used with the one-hot selection and still be within the scope of the present invention.

Figure 8:
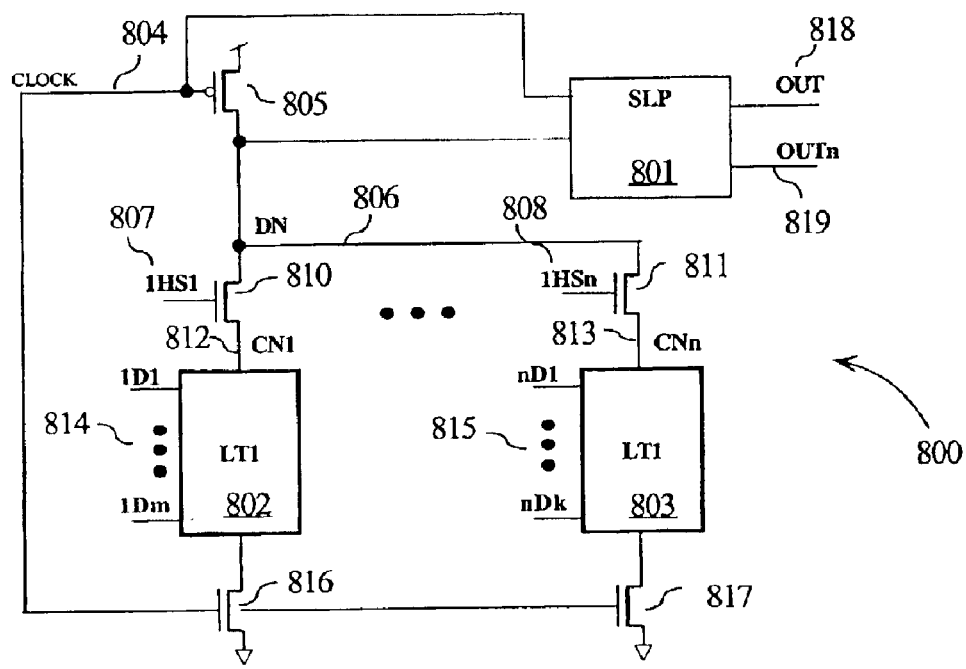
FIG. 8 is a generalized circuit diagram of a selection circuit according to embodiments of the present invention.

FIG. 8 is a circuit diagram illustrating a generalized selection circuit according to embodiments of the present invention. An SLP 801 having output 818 and complementary output 819 is coupled to clock signal 804 and a dynamic node 806. A plurality of logic trees (e.g., 802 and 803) are coupled to dynamic node 806 with devices NFETs 810 and 811 in response to one-hot selection signals 1HS1 and 1HSn. The logic trees coupled to a dynamic node 806 may have different numbers of multiple inputs (e.g., 814 and 815) and may differ in their functionality. There is a practical limit in the number of series devices between a dynamic node 806 and an assertion device (e.g., NFET 816 and NFET 817). The one-hot principle for controlling the selection devices (e.g., 1HS1 and 1HSn) is required to insure that the common node on the logic trees is precharged along with the dynamic node.

FIG. 3.1 illustrates a portion 300 of a data processing system incorporating LSDL circuits in accordance with the present inventive principles. System portion 300 may be implemented using a two-phase clock signal (denoted clock 1 and clock 2). A timing diagram which may be associated with system portion 300 will be discussed in conjunction with FIG. 3.2. LSDL blocks 302b that may be clocked by a second clock signal phase, clock 2, alternates with LSDL block 302a clocked by the first clock signal phase, clock 1. Additionally, system portion 300 may include static logic elements 304 between LSDL blocks. Typically, static circuit blocks 304 may include gain stages, inverters or static logic gates. Static circuit blocks 304 are differentiated from LSDL blocks 302a and 302b as they do not have dynamic nodes that have a precharge cycle. However, alternative embodiments may include any amounts of static logic. Additionally, as previously mentioned, an embodiment of system portion 300 may be implemented without static circuit blocks 304.

FIG. 3.2 illustrates a timing diagram which may correspond to logic system employing a two-phase, pulsed clock signal, such as system portion 300, FIG. 3.1, in accordance with the present inventive principles. The LSDL circuits evaluate during the LSDL evaluate, or drive, portion 306 of their respective clock signals. As previously described, the duty factor of each of clock 1 and clock 2 may be less than fifty percent (50%). The width of the LSDL drive portions 306 of the clock signals need only be sufficiently wide to allow the evaluate node (such as dynamic node 210, FIG.

2.1) to be discharged through the logic tree (for example, logic tree 204, FIG. 2.1). As previously described, the duration of the drive portion may be sufficiently narrow that leakage from the evaluation may be inconsequential. Consequently, LSDL circuits are not particularly sensitive to the falling edge of the clock signals, and in FIG. 3.2, the falling portion of the evaluate phase 306 of the clock signals has been depicted with cross-hatching. As noted herein above, the duty factor of clock 1 and clock 2 may be approximately thirty percent (30%) in an exemplary embodiment of the present invention. (It would be appreciated, however, that the present inventive principles may be incorporated in alternative embodiments which have other duty factors.) During the precharge portion 308 of the clock signals, the dynamic node (for example, dynamic node 210, FIG. 2.1) is precharged, as previously discussed. Clock 2 is 180° ($\pi$ radians) out of phase with clock 1 (shifted in time one-half of period T). Thus as shown, the evaluate portion 306 of clock 2 occurs during the precharge phase 308 of clock 1. Because in LSDL circuits, the output states may not change during the evaluate phase of the driving clock signal; the inputs to LSDL blocks, for example, LSDL blocks 302b, FIG. 3.1, are stable during the evaluate phase of the corresponding driving clock signal, clock 2. The time interval, between the end of the evaluate portion 306 of clock 1 and the rising edge of clock 2 may be established by the setup time of the LSDL, and the evaluation time of the static blocks, if any (for example, static blocks 304, FIG. 3.1). The time, Tau 301, together with duty factor may determine the minimum clock signal period for a particular LSDL circuit implementation. Thus, a system portion 300, FIG. 3.1 having a two-phase clock signal effects two dynamic evaluations per period, T, of the driving clock signals. It would be further appreciated by those of ordinary skill in the art that, in general, the present inventive principles may be incorporated in alternative embodiments of an LSDL system having a plurality, n, of clock signal phases. Such alternative embodiments would fall within the spirit and scope of the present invention.

An LSDL system in accordance with the principles of the present invention, such as system 300, FIG. 3.1, may be used, in an exemplary embodiment, in an arithmetic logic unit (ALU). A typical ALU architecture requires a significant number of exclusive-OR (XOR) operations. The XOR of two Boolean values requires having both senses of each of the Boolean values, that is, both the value and its complement (a⊕b=ab'+a'b). As previously described, use of dual rail dynamic logic to implement such functionality obviates the advantages in area and power otherwise obtained by dynamic logic. A data processing system including an ALU embodying the present inventive principles is illustrated in FIG. 4. The MUX function illustrated in FIG. 7.1 is also used in many areas of a data processing system when data from many sources may be selectively coupled to a single processing unit. The function illustrated in FIG. 7.2 may be used to modify or permutate the bits in a byte for example by shifting bit 1 to bit 0, bit 2 to bit 1, etc. The permute function is common in many microprocessor media units.

FIG. 4 is a high level functional block diagram of selected operational blocks that may be included in a central processing unit (CPU) 400. In the illustrated embodiment, CPU 400 includes internal instruction cache (I-cache) 440 and data cache (D-cache) 442 which are accessible to memory (not shown in FIG. 4) through bus 412, bus interface unit 444, memory subsystem 438, load/store unit 446 and corresponding memory management units: data MMU 450 and instruction MMU 452. In the depicted architecture, CPU 400 operates on data in response to instructions retrieved from I-cache 440 through instruction dispatch unit 448. Dispatch unit 448 may be included in instruction unit 454 which may also incorporate fetch unit 456 and branch processing unit 458 which controls instruction branching. An instruction queue 460 may interface fetch unit 456 and dispatch unit 448. In response to dispatched instructions, data retrieved from D-cache 442 by load/store unit 446 can be operated upon by one of fixed point unit (FXU) 460, FXU 462 or floating point execution unit (FPU) 464. Additionally, CPU 400 provides for parallel processing of multiple data items via vector execution unit (VXU) 466. VXU 466 includes vector permute unit 468 which performs permutation operations on vector operands, and vector arithmetic logic unit (VALU) 470 which performs vector arithmetic operations, which may include both fixed-point and floating-point operations on vector operands. VALU 470 may be implemented using LSDL in accordance with the present inventive principles, and in particular may incorporate LSDL systems, of which LSDL system 300, FIG. 3.1 is exemplary. Other units may employ LSDL selection circuits according to embodiments of the present invention.

Figure 5:
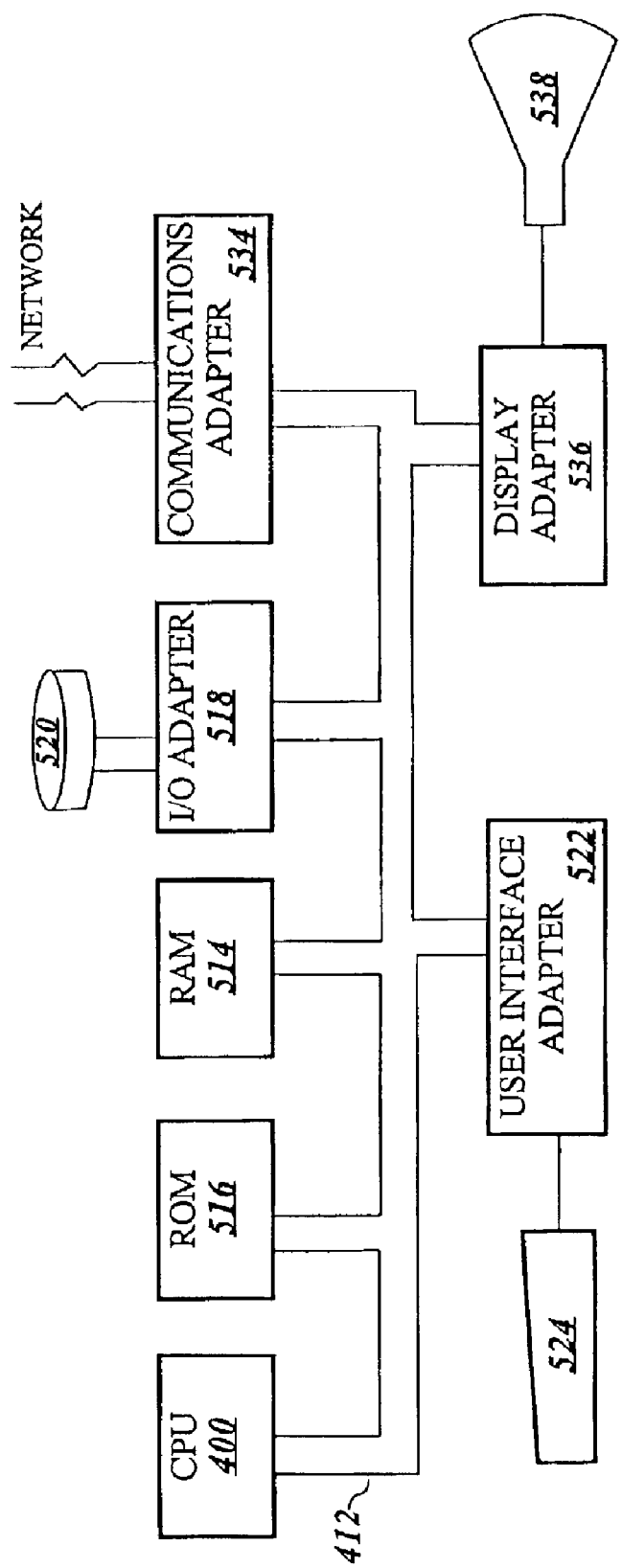
FIG. 5 illustrates a data processing system configured in accordance with the present invention.

A representative hardware environment 500 for practicing the present invention is depicted in FIG. 5, which illustrates a typical hardware configuration of a data processing system in accordance with the subject invention having CPU 400, incorporating LSDL selection circuits according to the present inventive principles, and a number of other units interconnected via system bus 412. The data processing system shown in FIG. 5 includes random access memory (RAM) 514, read only memory (ROM) 516, and input/output (I/O) adapter 518 for connecting peripheral devices such as disk units 520 to bus 412, user interface adapter 522 for connecting keyboard 524, mouse 526, and/or other user interface devices such as a touch screen device (not shown) to bus 412, communication adapter 534 for connecting the system to a data processing network, and display adapter 536 for connecting bus 412 to display device 538. Note that CPU 400 may reside on a single integrated circuit.

Although the present invention and its advantages have been described in detail, it should be understood that various changes, substitutions and alterations can be made herein without departing from the spirit and scope of the invention as defined by the appended claims.

What is claimed is:

1. A logic device comprising:
   a dynamic logic circuit generating a first logic output on a dynamic node, said dynamic node precharged to a first logic value during a first phase of a clock signal and evaluated to a second logic value during a second phase of said clock signal, said second logic value corresponding to a Boolean function of one or more input signals, said second logic value generated at a first common node exclusively coupled to said dynamic node in response to a corresponding one of a plurality of first select signals, and wherein said first common node is precharged to said first logic value with said precharge of said dynamic node; and
   a static logic circuit receiving said first logic output and generating a second logic output at a first output node having said second logic value during said second phase of said clock signal and maintaining said second logic value during said first phase of said clock signal, wherein said static logic circuit generates a second logic output at a second output node having a third logic value during said second phase of said clock signal and maintaining said third logic value during said first phase of said clock signal, said third logic value corresponding to a complement of said second logic value, and wherein said static logic circuit comprises a static complementary logic gate having an input node coupled to said dynamic node, an output node coupled to said first output node, a power supply node coupled to a power supply voltage and a ground node coupled to a first common node of parallel coupled first and second N-channel field effect transistor (NFETs), a second common node of said parallel coupled first and second NFETs coupled to a second power supply voltage, a gate of said first NFET coupled to said clock signal and a gate of said second NFET coupled to said second output node.

2. The logic device of claim 1, wherein said second logic value is generated at said first common node by exclusively coupling a second common node to said first common node in response to a corresponding one of a plurality of second select signals, said second common node having said second logic value, wherein said second common node is precharged to said first logic value concurrent with said precharge of said dynamic node.

3. The logic device of claim 1, wherein said dynamic circuit comprises a second PFET, said second PFET having a gate terminal coupled to said clock signal, a drain terminal coupled to a power supply voltage and source terminal coupled to said dynamic node.

4. The logic device of claim 1, wherein a duration of said first phase of said clock signal is less than a duration of said second phase of said clock signal, and wherein said duration of said first phase of said clock signal is selected such that a leakage from said dynamic node does not affect an evaluation of said dynamic node.

5. The logic device of claim 1, wherein said first common node is selected from N nodes, wherein N is greater than two but less than or equal to sixty four.

6. The logic device of claim 2, wherein said second common node is selected from M nodes, wherein M is greater than two but less than or equal to sixty four.

7. A logic device comprising:
a dynamic logic circuit generating a first logic output on a dynamic node, said dynamic node precharged to a first logic value during a first phase of a clock signal and evaluated to a second logic value during a second phase of said clock signal, said second logic value corresponding to a Boolean function of one or more input signals, said second logic value generated at a first common node exclusively coupled to said dynamic node in response to a corresponding one of a plurality of first select signals, and wherein said first common node is precharged to said first logic value with said precharge of said dynamic node; and
a static logic circuit receiving said first logic output and generating a second logic output at a first output node having said second logic value during said second phase of said clock signal and maintaining said second logic value during said first phase of said clock signal, wherein said static logic circuit generates a second logic output at a second output node having a third logic value during said second phase of said clock signal and maintaining said third logic value during said first phase of said clock signal, said third logic value corresponding to a complement of said second logic value, and
further including a logic inverter, an input of said inverter coupled to said first output node, an output of the inverter forming said second output node, and wherein a gate of a first P-channel field effect transistor (PFET) is coupled to said output of said logic inverter, a source of said first PFET coupled to said power supply voltage and a drain of said first PFET coupled to said first output node.

8. A data processing system comprising:
a central processing unit (CPU);
a memory operable for communicating instructions and operand data to said CPU, wherein the CPU includes one or more logic devices, each of said logic devices having a dynamic logic circuit, said dynamic logic circuit generating a first logic output on a dynamic node, said dynamic node precharged to a first logic value during a first phase of a clock signal and evaluated to a second logic value during a second phase of said clock signal, said second logic value corresponding to a Boolean function of one or more input signals, said second logic value generated at a first common node, wherein said first common node is exclusively coupled to said dynamic node in response to a corresponding one of a plurality of first select signals, and wherein said first common node is precharged to said first logic value with said precharge of said dynamic node and a static logic circuit receiving said first logic output and generating a second logic output at a first output node having said second logic value during said second phase of said clock signal and maintaining said second logic value during said first phase of said clock signal,
wherein said static logic circuit generates a second logic output at a second output node having a third logic value during said second phase of said clock signal and maintaining said third logic value during said first phase of said clock signal, said third logic value corresponding to a complement of said second logic value, and
wherein said static logic circuit-comprises a static complementary logic gate having an input node coupled to said dynamic node, an output node coupled to said first output node, a power supply node coupled to a power supply voltage and a ground node coupled to a first common node of parallel coupled first and second N-channel field effect transistor (NFETs), a second common node of said parallel coupled first and second NFETs coupled to a second power supply voltage, a gate of said first NFET coupled to said clock signal and a gate of said second NFET coupled to said second output node.

9. The data processing system of claim 8, wherein said second logic value is generated at said first common node by exclusively coupling a second common node to said first common node in response to a corresponding one of a plurality of second select signals, said second common node having said second logic value, wherein said second common node is precharged to said first logic value concurrent with said precharge of said dynamic node.

10. The data processing system of claim 8, wherein said dynamic circuit comprises a second PFET, said second PFET having a gate terminal coupled to said clock signal, a drain terminal coupled to a power supply voltage and source terminal coupled to said dynamic node.

11. The data processing system of claim 8, wherein a duration of said first phase of said clock signal is less than a duration of said second phase of said clock signal, and wherein said duration of the first phase of said clock signal is selected such that a leakage from said dynamic node does not affect an evaluation of said dynamic node.

12. The data processing system of claim 8, wherein said first common node is selected from N nodes, wherein N is greater than two but less than or equal to sixty four.

13. The data processing system of claim 9, wherein said second common node is selected from M nodes, wherein M is greater than two but less than or equal to sixty four.

14. A data processing system comprising:

a central processing unit (CPU);

a memory operable for communicating instructions and operand data to said CPU, wherein the CPU includes one or more logic devices, each of said logic devices having a dynamic logic circuit, said dynamic logic circuit generating a first logic output on a dynamic node, said dynamic node precharged to a first logic value during a first phase of a clock signal and evaluated to a second logic value during a second phase of said clock signal, said second logic value corresponding to a Boolean function of one or more input signals, said second logic value generated at a first common node, wherein said first common node is exclusively coupled to said dynamic node in response to a corresponding one of a plurality of first select signals, and wherein said first common node is precharged to said first logic value with said precharge of said dynamic node and a static logic circuit receiving said first logic output and generating a second logic output at a first output node having said second logic value during said second phase of said clock signal and maintaining said second logic value during said first phase of said clock signal, wherein said static logic circuit generates a second logic output at a second output node having a third logic value during said second phase of said clock signal and maintaining said third logic value during said first phase of said clock signal, said third logic value corresponding to a complement of said second logic value, and further including a logic inverter, an input of said inverter coupled to said first output node, an output of the inverter forming said second output node, and wherein a gate of a first P-channel field effect transistor (PFET) is coupled to said output of said logic inverter, a source of said first PFET coupled to said power supply voltage and a drain of said first PFET coupled to said first output node.

* * * * *